United States Patent [19]

McDermott

[11] Patent Number: 4,600,816
[45] Date of Patent: Jul. 15, 1986

[54] ATTENUATOR ADAPTED FOR CLIP MOUNTING TO CONNECTING BLOCK TERMINALS

[75] Inventor: Noel C. McDermott, Santa Cruz, Calif.

[73] Assignee: Larus Corporation, San Jose, Calif.

[21] Appl. No.: 715,067

[22] Filed: Mar. 21, 1985

Related U.S. Application Data

[63] Continuation of Ser. No. 414,898, Sep. 3, 1982, abandoned.

[51] Int. Cl.⁴ .................. H01C 1/028; H01R 9/09; H03H 7/24; H05K 1/18
[52] U.S. Cl. .................. 179/190; 333/81 R; 338/221; 339/17 LC
[58] Field of Search ............ 179/190, 98, 91 R, 16 F, 179/175.1 R, 175; 333/81 R; 338/221, 220, 320; 361/406, 408; 339/17 LC, 17 L; 174/138 F

[56] References Cited

U.S. PATENT DOCUMENTS

| | | | |
|---|---|---|---|
| 3,177,406 | 4/1965 | Bernstein ..................... | 361/406 X |
| 3,641,475 | 2/1972 | Irish et al. .................... | 339/17 L |
| 3,908,178 | 9/1975 | Johnson et al. ............... | 333/81 R |
| 4,116,524 | 9/1978 | DeNigris et al. .............. | 339/113 R |
| 4,126,369 | 11/1978 | Rapata et al. ................. | 339/113 R |
| 4,220,834 | 9/1980 | Holce et al. ................... | 179/190 |

FOREIGN PATENT DOCUMENTS

| | | | |
|---|---|---|---|
| 1023979 | 3/1966 | United Kingdom .......... | 339/17 LC |
| 1302272 | 1/1973 | United Kingdom .......... | 333/81 R |

*Primary Examiner*—Thomas W. Brown
*Attorney, Agent, or Firm*—Blakely Sokoloff Taylor & Zafman

[57] ABSTRACT

An attenuator introduces a known attenuation into telephone circuitry at connecting block terminals of incoming and outgoing, tip and ring lines when clipped thereto. The attenuator is particularly suited for attachment to an insulation displacement terminating block, known as a 66 type block, for telephone wire circuits or pairs. An attenuation network in the form of a balanced square pad is mounted on a substrate to form a printed circuit board and resistance assembly. Electrical contact means include four electrical contacts that have tail portions connected to the attenuation network and clip portions that grip the connecting block terminals of the incoming and outgoing, tip and ring lines. The printed circuit board and resistance assembly and the electrical contact means are received within a protective, insulating cover and retained therein by potting material. The attenuation rating or loss for the attenuator is marked on the top surface of the cover.

1 Claim, 6 Drawing Figures

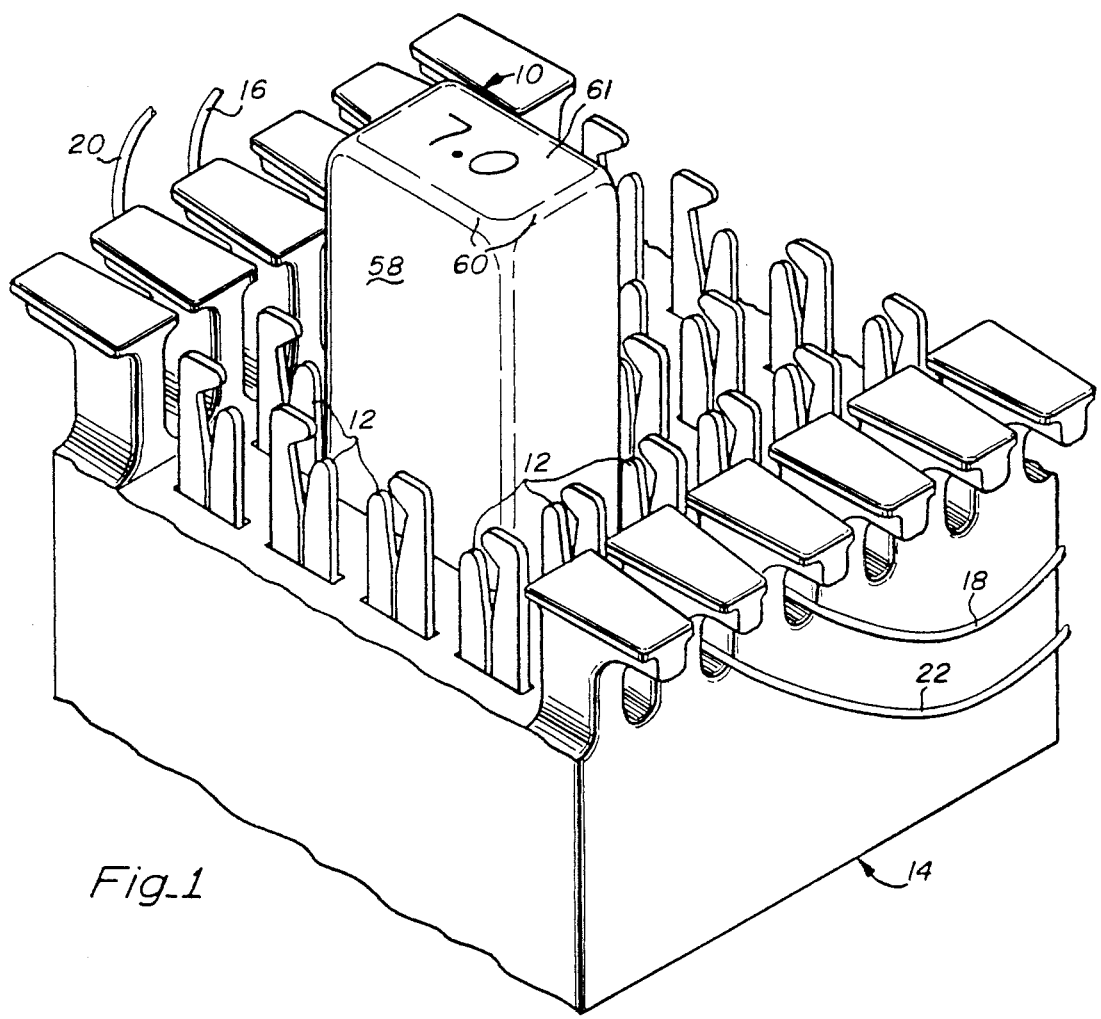
Fig_1
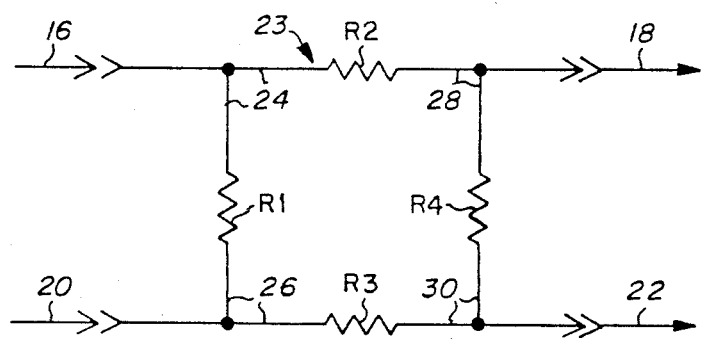
Fig_2

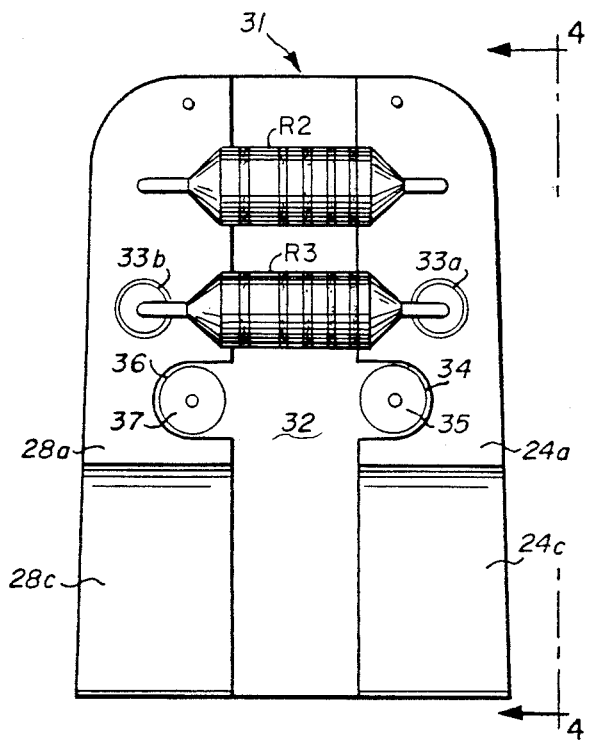
Fig_3
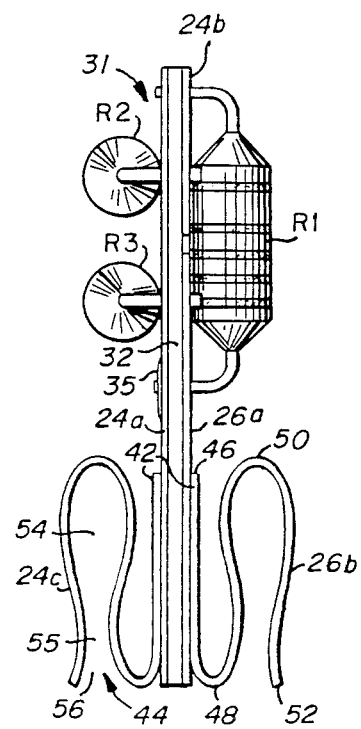
Fig_4
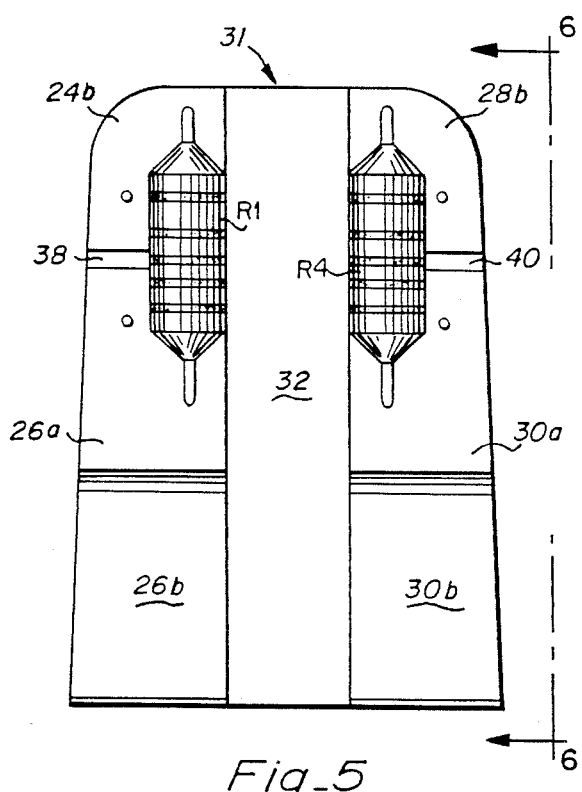
Fig_5
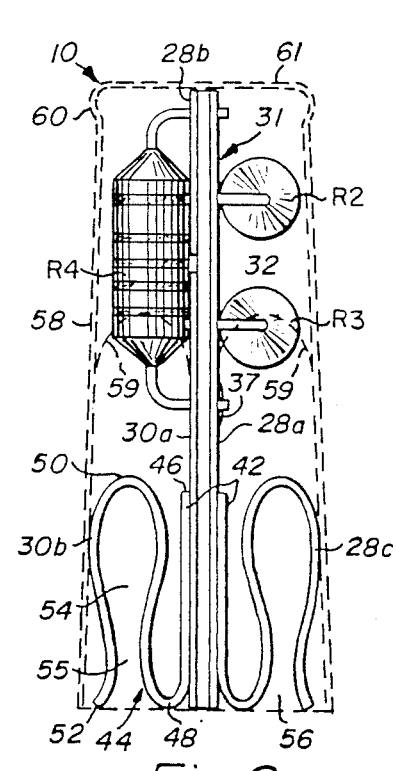
Fig_6

ATTENUATOR ADAPTED FOR CLIP MOUNTING TO CONNECTING BLOCK TERMINALS

This is a continuation of application Ser. No. 414,898 filed Sept. 3, 1982, now abandoned.

BACKGROUND OF THE INVENTION

1. Field of the Invention

This invention relates generally to telephone circuitry, and more specifically it concerns a balanced attenuator for introducing a known attenuation into telephone circuitry at connecting block terminals of incoming and outgoing, tip and ring lines by simply clipping the attenuator onto terminals that are normally connected by bridging clips.

2. Description of the Prior Art

Telephone line circuits in different areas or different telephone systems operate at varying signal power levels for various reasons. Attenuator networks are required in telephone circuitry to balance the signal power level between telephone line circuits that operate at different levels. By balancing the signal power levels in telephone connections, undesirable characteristics such as over modulation, distortion, splatter, talker echo and singing are minimized. An attenuator is an arrangement of resistors, capacitors, etc., that introduces a known attenuation into a telephone circuit or line, while attenuation refers to the decrease in signal (current, voltage, or power level) during its transmission from one point to the next, normally expressed in decibels.

Prior art attenuation devices were originally in the form of bulky resistance networks mounted on vacuum tube type bases which were plugged into the telephone line circuits at telephone central offices. Often whole rooms full of these attenuators were required for a relatively small number of circuits. Subsequently, improved technology led to plug-in attenuators of much smaller size. These attenators were constructed by using microtechnology such as thin and thick film conductor and resistor elements. An attenuator of this nature is shown and decribed in U.S. Pat. No. 4,220,834 that issued to Thomas J. Holce, et al.

A multiple component plug-in device is disclosed in U.S. Pat. No. 3,908,178 that issued to B. E. Johnson and J. E. Danneman. This device uses fewer parts and is somewhat less bulky than other prior art attenuator devices but still requires a large number of components to effectively cover the range of attenuation necessary for telephone uses. The Johnson, et al. discloses further contemplates a three component combination which has multiple connection points.

Another prior art attenuator includes rheostats for adjusting the resistance of specific elements, but such attenuators have been very large and have required significant space for installation. A variable attenuator uses switching to vary the attenuation introduced into a circuit, but such variable attenuators require more space because each have multiple attenuation networks. An example of a switchable incremental attenuator is disclosed in U.S. Pat. No. 4,442,325, issued Apr. 10, 1984.

Building entrance or station apparatus terminations, such as between incoming trunk telephone lines and a PBX or private telephone system, have connecting block terminals that are normally interconnected at a demarcation point by removable bridge clips. Clips for bridging adjacent terminals are sold under the trademark "Bridgeklip-2" by dek, Inc., 3480 Swenson Drive, St. Charles, Ill. 60174. Other types of clips that interconnect two adjacent spade-like terminals of a connecting block are disclosed in U.S. Pat. No. 4,113,340 of George M. Rapata, U.S. Pat. No. 4,116,524 of Ernest G. DeNigris et al., and U.S. Pat. No. 4,126,369 of George M. Rapata, et al.

Normally, attenuator networks are mounted on distributing frame blocks or equipment bays, and it is necessary to wire to the block or the bay. Such attenuator mountings require additional hardware and wiring.

SUMMARY OF THE INVENTION

An object of the present invention is to provide an attenuator that clips onto the connecting block terminals between the incoming and outgoing, tip and ring lines of a connecting block circuit, thereby inserting a known attenuation into the circuit without the need of additional attenuation mounting hardware and wiring. While the attenuator fits various block types, it is particularly suited to an insulation displacement terminating block, known as a 66 type block, for telephone wire circuits or pairs.

Another object of the invention is to provide an attenuator that can provide attenuation for a single pair of tip and ring lines without having to install a separate attenuator mounting.

A further object of the invention is to provide an attenuator of miniature size that clips or affixes onto an existing type 66 connecting block and thereby reduces the space and hardware requirements for providing the necessary circuit attenuation.

In accordance with the present invention there is provided an attenuator for introducing a known attenuation into telephone circuitry at connecting block terminals of incoming and outgoing, tip and ring lines of a block circuit by simply clipping the attenuator onto the terminals, said attenuator comprising an attenuation network, an electrical contact means having tail portions connected to the attenuation network and having clip portions that grip the connecting block terminals of incoming and outgoing, tip and ring lines of the telephone circuit.

These and other objects and advantages of the present invention will no doubt become obvious to those of ordinary skill in the art after having read the following detailed description of the preferred embodiment which is illustrated in the various drawing figures.

IN THE DRAWING

FIG. 1 is a perspective view of a type 66 connecting block fragment having terminals on which an attenuator embodying the present invention is mounted.

FIG. 2 is a schematic diagram of the electrical circuit for the attenuator network inserted into the telephone lines.

FIG. 3 is a view in side elevation of one side of a printed circuit board and resistance assembly that fits within the attenuator shown in FIG. 1.

FIG. 4 is an end view in elevation of the printed circuit board and resistance assembly taken on the line 4—4 of FIG. 3.

FIG. 5 is a view in side elevation of the printed circuit board and resistance assembly on the side opposite that is shown in FIG. 3.

FIG. 6 is an end view in elevation of the printed circuit board and resistance assembly taken on the line 6—6 of FIG. 5 with the attenuator cover and potting material indicated in phantom line.

DETAILED DESCRIPTION OF THE PREFERRED EMBODIMENT

Looking now at FIG. 1, an attenuator 10 is shown mounted upon terminals 12 of a connecting block 14, that is an insulation displacement terminating block known as a 66 type block for telephone wire circuits or pairs. Beneath the attenuator, the terminals are connected in a telephone circuit including an incoming tip line 16, an outgoing tip line 18, an incoming ring line 20 and an outgoing ring line 22.

With reference to FIG. 2, an attenuation network, indicated generally by reference numeral 23, is a balanced square pad or "0" pad that interconnects lines 16, 18, 20 and 22. The attenuation network includes a conductor 24 and a conductor 26 that connect a shunt resistor R1 between the lines 16 and 20. A series resistor R2 is connected between the lines 16 and 18 by the conductor 24 and a conductor 28. The conductor 26 and a conductor 30 connect a series resistor R3 between the lines 20 and 22. A shunt resistor R4 is connected by the conductors 28 and 30 in a location between the lines 18 and 22. The resistors R1, R2, R3 and R4 provide a balanced resistive pad that introduces a predetermined circuit loss while maintaining the telephone circuit network impedance at the terminals 12 of incoming lines 16 and 20 and outgoing lines 18 and 22.

As shown in FIGS. 3-6, a printed circuit board and resistance assembly, indicated generally by reference numeral 31, has a substrate 32 of electrically non-conductive material. The conductor 24 is formed by a thin metallic ribbon 24a on the side of the substrate illustrated in FIG. 3, a thin metallic ribbon 24b on the substrate side illustrated in FIG. 5, and an electrical contact 24c. The ribbons 24a and 24b are interconnected by the leads passing through the substrate to the resistors R1 and R2. The conductor 28 is formed by a thin metallic ribbon 28b (FIG. 5), and an electrical contact 28c. The ribbons 28a and 28b are interconnected by the leads passing through the substrate to the resistors R2 and R4.

The conductor 26 is formed by a thin metallic ribbon 26a and an electrical contact 26b, while the conductor 30 is formed by a thin metallic ribbon 30a and an electrical contact 30b. The ribbons 26a and 30a are interconnected by the resistor R3 and the individual leads thereto. These leads are isolated from ribbons 24a and 28a by clearance spaces 33a and 33b, respectively. The ribbons 24a and 28a are also isolated from the lower most leads to resistors R1 and R4 by clearance spaces 34 and 36 about the circular ends 35 and 37 of the leads of resistors R1 and R4. The ribbons 26a and 30a are isolated from ribbons 24b and 28b by spaces 38 and 40 respectively, interposed therebetween. The resistors R1 and R4 have equal resistance values, as do resistors R2 and R3, thereby enabling the reversibility of the attenuator upon its mating contacts without affecting the attenuation introduced into the circuits by the attenuation network 23.

The four electrical contacts 24c, 26b, 28c and 30b form an electrical contact means that enables connection of the attenuation network 23 to the telephone circuit lines 16, 18, 20 and 22. Each contact is formed from a flat strip of sheet metal reversely bent at about the third points to form a flat tail portion 42 and a clip portion 44. Each contact is mounted to the printed circuit board assembly 31 by the flat tail portion that extends downwardly from an upper end 46 to a lower bend 48 adjacent the bottom edge of the assembly. The clip portion 44 extends from the lower bend to an upper bend 50 and thence back again to a lower end 52 adjacent to the lower bend. The interior surfaces of the clip portion, between the bends and the lower end, define a terminal receiving slot 54. These surfaces converge about an open throat 55 wherein a terminal 12 can be gripped by the clip portion. From the throat downward, the surfaces diverge to the lower end and the lower bend to define therebetween a flared entrance opening 56 through which a terminal can be guided to the open throat. A pair of the contacts are mounted on both sides of the assembly, with one contact adjacent each side edge thereof.

Looking now at FIG. 6, the printed circuit board and resistance assembly 31 fits within a thin plastic cover 58. This cover has approximate outside dimensions of ⅞ inch length or height, ⅜ inch width and 5/16 inch thickness. The top portion of the cover is filled with a potting material such as epoxy resin to the lines 59, and the printed circuit board and resistance assembly is inserted therein. The assembly fits entirely within the cover which provides insulation, dust protection and a pleasing appearance for the attenuator 10. Ridges 60, shown in FIGS. 1 and 6, are provided adjacent the top portion of the cover for grasping with fingers when removing or installing the attenuator from or to the connecting block terminals 12. Marked on a top surface 61 of the cover, as shown in FIG. 1, is the attenuation rating in decibels of the attenuator.

From the foregoing description, it will be seen that the attenuator 10 clips onto the connecting block terminals 12 of lines 16, 18, 20 and 22. A known attenuation is thereby inserted into the circuit without the need of additional attenuation hardware and wiring. This attenuator can provide attenuation for a single circuit of tip and ring lines without having to install a separate block mounting. Since the attenuator is of miniature size, it can fit on an existing connecting block and thereby reduce the space requirement for attenuation hardware.

Although the present invention has been described in terms of the presently preferred embodiments, it is to be understood that such disclosure is not to be interpreted as limited. Various alterations and modifications will no doubt become apparent to those skilled in the art after having read the above disclosure. Accordingly, it is intended that the appended claims be interpreted as covering all alterations and modifications as fall within the true spirit and scope of the invention.

I claim:

1. A device for introducing a known balanced attenuation into a telephone circuit including incoming and outgoing tip and ring lines at terminals of a telephone connecting block, wherein said device is mounted directly to said connecting block terminals, said device comprising:

a generally rectangular shaped substrate comprised of electrically conductive material;

a first conductive path disposed on said substrate, said first conductive path comprised of a thin metallic ribbon disposed on a first side of said substrate;

a second conductive path disposed on said substrate, said second conductive path comprised of a thin metallic ribbon disposed on said first side of said substrate, said second conductive path not contacting said first conductive path;

a third conductive path disposed on said substrate, said third conductive path comprised of a thin metallic ribbon disposed on a second side of said substrate, said third conductive path not contacting said first and second conductive paths;

a fourth conductive path disposed on said substrate, said fourth conductive path comprised of a thin metallic ribbon disposed on said second side of said substrate, said fourth conductive path not contacting said first, second and third conductive paths;

a first series resistor coupled to said first and second conductive paths for providing a resistive path between said incoming and outgoing tip lines;

a second series resistor coupled to said third and fourth conductive paths for providing a resistive path between said incoming and outgoing ring lines, said first and second series resistors having the same value of resistance;

a first shunt resistor coupled to said first and third conductive paths;

a second shunt resistor coupled to said second and fourth conductive paths, said first and second shunt resistors having the same value of resistance;

a first connecting means electrically coupled to said first conductive path, said first connecting means comprised of a flat strip of conductive material reversely bent at about the third points to form a first clip for mounting on said connecting block terminals;

a second connecting means electrically coupled to said second conductive path, said second connecting means comprised of a flat strip of conductive material reversely bent at about the third points to form a second clip for mounting on said connecting block terminals;

a third connecting means electrically coupled to said third conductive path, said third connecting means comprised of a flat strip of conductive material reversely bent at about the third points to form a third clip for mounting on said connecting block terminals;

a fourth connecting means electrically coupled to said fourth conductive path, said fourth connecting means comprised of a flat strip of conductive material reversely bent at about the third points to form a fourth clip for mounting on said connecting block terminals; and a non-conductive cover for surrounding said substrate, said resistors and said conductive paths, said cover including an opening for access to said connecting means said cover partially filled with epoxy resin, said cover including a ridge on the outside thereof for grasping with fingers, said cover including markings for indicating the attenuation rating in decibels of said device;

whereby attenuation is provided to a single circuit of said tip and ring lines without separate block mounting or additional hardware.

* * * * *

UNITED STATES PATENT AND TRADEMARK OFFICE
CERTIFICATE OF CORRECTION

PATENT NO. : 4,600,816

DATED : July 15, 1986

INVENTOR(S) : McDermott

It is certified that error appears in the above-identified patent and that said Letters Patent is hereby corrected as shown below:

| COLUMN | LINE | DESCRIPTION |
|--------|------|-------------|
| 1 | 51 | Please delete "discloses" and insert --disclosure--. |

Signed and Sealed this

Tenth Day of March, 1987

Attest:

DONALD J. QUIGG

Attesting Officer

Commissioner of Patents and Trademarks